(12) United States Patent
Bourjot et al.

(10) Patent No.: US 10,230,000 B2
(45) Date of Patent: Mar. 12, 2019

(54) VERTICAL-TRANSPORT TRANSISTORS WITH SELF-ALIGNED CONTACTS

(71) Applicant: GLOBALFOUNDRIES Inc., Grand Cayman (KY)

(72) Inventors: Emilie Bourjot, Cohoes, NY (US); Daniel Chanemougame, Niskayuna, NY (US); Tek Po Rinus Lee, Albany, NY (US); Ruilong Xie, Niskayuna, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/671,605

(22) Filed: Aug. 8, 2017

(65) Prior Publication Data

US 2019/0051757 A1   Feb. 14, 2019

(51) Int. Cl.
*H01L 29/786* (2006.01)
*H01L 29/66* (2006.01)
*H01L 29/423* (2006.01)

(52) U.S. Cl.
CPC .. *H01L 29/78618* (2013.01); *H01L 29/42384* (2013.01); *H01L 29/66666* (2013.01); *H01L 29/78642* (2013.01); *H01L 29/78696* (2013.01)

(58) Field of Classification Search
CPC ......... H01L 29/78642; H01L 29/41741; H01L 29/7848; H01L 29/0653; H01L 21/823885; H01L 29/78618; H01L 29/78696; H01L 29/42392; H01L 21/823814; H01L 21/823807; H01L 21/823871; H01L 21/823828
See application file for complete search history.

(56) References Cited

U.S. PATENT DOCUMENTS

| 5,889,298 | A | 3/1999 | Plumton et al. |
| 6,229,197 | B1 | 5/2001 | Plumton et al. |
| 2016/0049397 | A1* | 2/2016 | Chang ............... H01L 27/092 257/329 |
| 2016/0343800 | A1 | 11/2016 | Grivna et al. |
| 2016/0344353 | A1 | 11/2016 | Watts et al. |
| 2016/0379847 | A1 | 12/2016 | Porwol et al. |

FOREIGN PATENT DOCUMENTS

DE    102016111573 A1    12/2016

* cited by examiner

*Primary Examiner* — Sonya D. McCall-Shepard
(74) *Attorney, Agent, or Firm* — Thompson Hine LLP; Anthony Canale

(57) ABSTRACT

Methods and structures that include a vertical-transport field-effect transistor. A semiconductor fin is formed that projects from a first source/drain region. A second source/drain region is spaced vertically along the semiconductor fin from the first source/drain region. A gate stack is arranged between the second source/drain region and the first source/drain region. A spacer is formed adjacent to a sidewall of the second source/drain region. A first contact is connected with a top surface of the second source/drain region, a second contact is connected with a top surface of the first source/drain region, and a third contact is connected with a top surface of the gate stack. The spacer is arranged between the second source/drain region and the second contact or between the second source/drain region and the third contact.

19 Claims, 6 Drawing Sheets

VERTICAL-TRANSPORT TRANSISTORS WITH SELF-ALIGNED CONTACTS

BACKGROUND

The present invention relates to semiconductor device fabrication and integrated circuits and, more specifically, to methods for forming a vertical-transport field-effect transistor and structures for a vertical-transport field-effect transistor.

Device structures for a field-effect transistor generally include a body region, a source and a drain defined in the body region, and a gate electrode configured to switch carrier flow in a channel formed in the body region. When a control voltage exceeding a designated threshold voltage is applied to the gate electrode, carrier flow occurs in an inversion or depletion layer in the channel between the source and drain to produce a device output current. The body region and channel of a planar field-effect transistor are located beneath the top surface of a substrate on which the gate electrode is supported.

Planar field-effect transistors and fin-type field-effect transistors constitute a general category of transistor structures in which the direction of gated current in the channel is in a horizontal direction parallel to the substrate surface. In a vertical-transport field-effect transistor, the source and the drain are arranged at the top and bottom of a semiconductor fin or pillar. The direction of the gated current transport in the channel between the source and drain is generally perpendicular (i.e., vertical) to the substrate surface and, therefore, parallel to the height of the semiconductor fin or pillar.

SUMMARY

In an embodiment, a method is provided for forming a vertical-transport field-effect transistor. The method includes forming a semiconductor fin that projects from a first source/drain region, epitaxially growing a second source/drain region that is spaced vertically along the semiconductor fin from the first source/drain region, forming a gate stack arranged between the second source/drain region and the first source/drain region, and forming a spacer adjacent to a sidewall of the second source/drain region. The method further includes forming a first contact connected with a top surface of the second source/drain region, forming a second contact connected with a top surface of the first source/drain region, and forming a third contact connected with a top surface of the gate stack. The spacer is arranged between the second source/drain region and the second contact or between the second source/drain region and the third contact.

In an embodiment, a structure is provided for a vertical-transport field-effect transistor. The structure includes a first source/drain region having a top surface, a semiconductor fin that projects from the top surface of the first source/drain region, and a second source/drain region that is spaced vertically along the semiconductor fin from the first source/drain region. The structure further includes a gate stack arranged between the second source/drain region and the first source/drain region, a spacer adjacent to a sidewall of the second source/drain region, a first contact connected with the top surface of the second source/drain region, a second contact connected with a top surface of the first source/drain region, and a third contact connected with a top surface of the gate stack. The spacer is arranged between the second source/drain region and the second contact or between the second source/drain region and the third contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
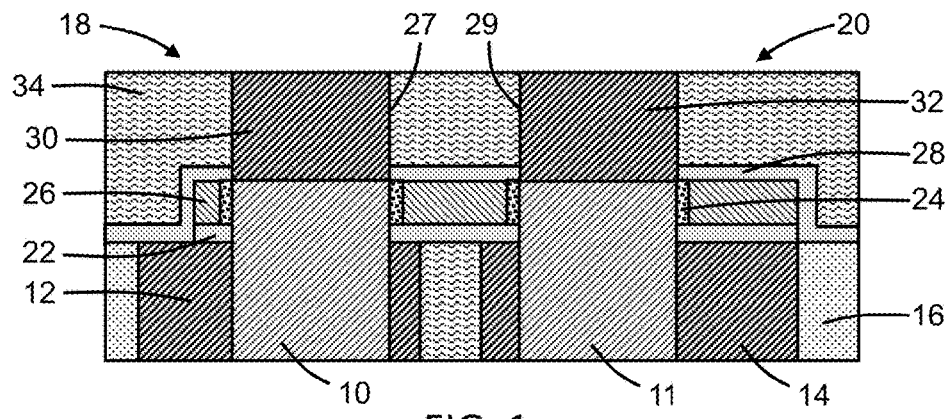
FIGS. 1-7 are cross-sectional views showing a structure at successive fabrication stages of a processing method in accordance with embodiments of the invention.

With reference to FIG. 1 and in accordance with embodiments of the invention, a fin 10 projects in a vertical direction from a bottom source/drain region 12 and a fin 11 projects in a vertical direction from a bottom source/drain region 14. As used herein, the term "source/drain region" connotes a doped region of semiconductor material that can function as either a source or a drain of a vertical-transport field-effect transistor. The fins 10, 11 and the bottom source/drain regions 12, 14 are used to form complementary vertical-transport field-effect transistors as described hereinbelow. The fins 10, 11 may be formed from an epitaxial layer of semiconductor material, such as undoped or intrinsic silicon, that is grown on the bottom source/drain regions 12, 14 and patterned using photolithography and etching processes, such as a sidewall imaging transfer (SIT) process or self-aligned double patterning (SADP).

In connection with the formation of an n-type vertical-transport field effect transistor 18, the bottom source/drain region 12 may be composed of silicon and include a concentration of an n-type dopant from Group V of the Periodic Table (e.g., phosphorus (P) and/or arsenic (As)) that imparts n-type electrical conductivity to the constituent semiconductor material. In connection with the formation of a p-type vertical-transport field effect transistor 20, the bottom source/drain region 14 may be composed of a silicon-germanium (SiGe) alloy and include a concentration of p-type dopant from Group III of the Periodic Table (e.g., boron (B), aluminum (Al), gallium (Ga), and/or indium (In)) that imparts p-type electrical conductivity to the constituent semiconductor material. A dielectric layer 16, which may be composed of a dielectric material, such as an oxide of silicon (e.g., silicon dioxide ($SiO_2$)), may electrically isolate the bottom source/drain region 12 from the bottom source/drain region 14.

A bottom spacer layer 22 is arranged on the bottom source/drain regions 12, 14. The bottom spacer layer 22 may be composed of a dielectric material, such as silicon nitride ($Si_3N_4$), that is deposited by a directional deposition technique, such as high-density plasma (HDP) deposition or gas cluster ion beam (GCIB) deposition. The fins 10, 11 extend in the vertical direction through the thickness of the bottom spacer layer 22.

A gate dielectric layer 24 is arranged on the sidewalls of the fins 10, 11. The gate dielectric layer 24 may be composed of a dielectric material, such as a high-k dielectric having a dielectric constant (e.g., permittivity) higher than the dielectric constant of $SiO_2$. Candidate high-k dielectric materials for the gate dielectric layer 24 include, but are not limited to, a hafnium-based dielectric material like hafnium oxide ($HfO_2$), a layered stack of a hafnium-based dielectric material and another other dielectric material (e.g., aluminum oxide ($Al_2O_3$)), or combinations of these and other dielectric materials.

A gate stack 26 is arranged on the bottom spacer layer 22 and is separated from the fins 10, 11 by the gate dielectric layer 24. The gate stack 26 may be composed of one or more conformal barrier metal layers and/or work function metal layers, such as titanium aluminum carbide (TiAlC), titanium nitride (TiN), cobalt (Co), tungsten (W), or combinations of these and other metals. The layers of gate stack 26 may be serially deposited by, for example, physical vapor deposition (PVD) or CVD, on the fins 10, 11 and etched back.

A top spacer layer 28 is arranged on the gate stack 26. The top spacer layer 28 may be composed of a dielectric material, such as silicon nitride ($Si_3N_4$), that is deposited by a directional deposition technique, such as high-density plasma (HDP) deposition or gas cluster ion beam (GCM) deposition. The fins 10, 11 extend in the vertical direction through the thickness of the top spacer layer 28.

A top source/drain region 30 is arranged on the top surface of the fin 10 that is exposed through the top spacer layer 28. A top source/drain region 32 is arranged on the top surface of the fin 11 that is exposed through the top spacer layer 28. The top source/drain region 30 includes sidewalls 27 that surround its circumference and the top source/drain region 32 includes sidewalls 29 that surround its circumference. The top source/drain regions 30, 32 may extend laterally to slightly overlie the gate stack 26 at their outer perimeters, and may be trimmed at their sidewalls 27, 29 using a wet isotropic etching process to reduce the extent of these lateral extensions.

The top source/drain region 30 may be composed of semiconductor material that is doped to have the same conductivity type as the bottom source/drain region 12. If the bottom source/drain region 12 is n-type, then the top source/drain region 30 may be a section of semiconductor material formed by an epitaxial growth process with in-situ doping, and may include a concentration of an n-type dopant from Group V of the Periodic Table (e.g., phosphorus (P) and/or arsenic (As)) that imparts n-type electrical conductivity to the constituent semiconductor material. The top source/drain region 32 may be composed of semiconductor material that is doped to have the same conductivity type as the bottom source/drain region 14. If the bottom source/drain region 14 is p-type, then the top source/drain region 32 may be a section of semiconductor material formed by an epitaxial growth process with in-situ doping, and may include a concentration of a p-type dopant from Group III of the Periodic Table (e.g., boron (B), aluminum (Al), gallium (Ga), and/or indium (In)) that imparts p-type electrical conductivity to the constituent semiconductor material. In an embodiment, the top source/drain region 30 and the top source/drain region 32 may be formed by selective epitaxial growth (SEG) processes in which the constituent semiconductor material nucleates for epitaxial growth on semiconductor surfaces (e.g., fins 10, 11), but does not nucleate for epitaxial growth from insulator surfaces.

An interlayer dielectric layer 34 is applied that covers the field-effect transistors. The interlayer dielectric layer 34 may be composed of a dielectric material, such as an oxide of silicon (e.g., silicon dioxide ($SiO_2$)) deposited by chemical vapor deposition (CVD).

Figure 2:
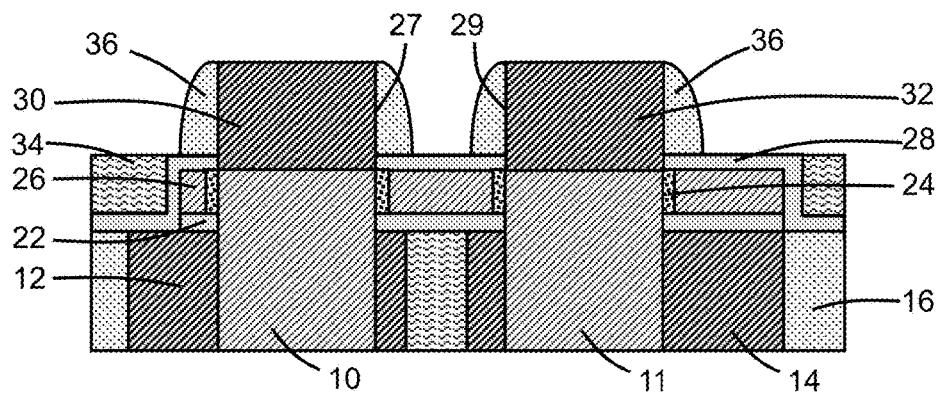

With reference to FIG. 2 in which like reference numerals refer to like features in FIG. 1 and at a subsequent fabrication stage, the interlayer dielectric layer 34 is recessed by an etch-back process with a timed etching process to reveal the sidewalls 27, 29 of the top source/drain regions 30, 32 and to reveal a section of the top spacer layer 28 covering the gate stack 26. In an embodiment, the sidewalls 27, 29 of the top source/drain regions 30, 32 may be fully revealed.

Spacers 36 are arranged adjacent to the sidewalls 27 of the top source/drain region 30, as well as adjacent to the sidewalls 29 of the top source/drain region 32. The spacers 36 are formed after the interlayer dielectric layer 34 is recessed. The spacers 36 may be formed by depositing a conformal layer comprised of a dielectric material chosen to etch selective to the dielectric material constituting interlayer dielectric layer 34 and shaping the conformal layer with an anisotropic etching process, such as reactive ion etching (RIE). As used herein, the term "selective" in reference to a material removal process (e.g., etching) connotes that the material removal rate (i.e., etch rate) for the targeted material is higher than the material removal rate (i.e., etch rate) for at least another material exposed to the material removal process. The spacers 36 may be composed of a nitride-based material, such as silicon nitride ($Si_3N_4$), silicon oxynitride (SiON), silicon oxycarbide (SiOC), or silicon oxycarbonitride (SiOCN), deposited by, for example, atomic layer deposition (ALD).

Figure 3:
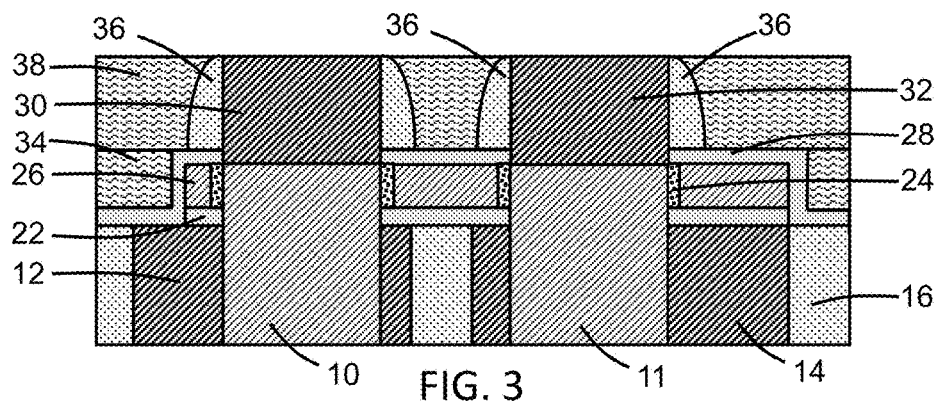

With reference to FIG. 3 in which like reference numerals refer to like features in FIG. 2 and at a subsequent fabrication stage, a gap-fill dielectric layer 38 is deposited and planarized to the top surfaces 31, 33 of the top source/drain regions 30, 32 with, for example, chemical mechanical processing (CMP) to fill the open spaces. The gap-fill dielectric layer 38 may be composed of a dielectric material, such as an oxide of silicon (e.g., silicon dioxide ($SiO_2$)) deposited by chemical vapor deposition (CVD). The top surfaces 31, 33 of the top source/drain regions 30, 32 are revealed by the planarization.

Figure 4:
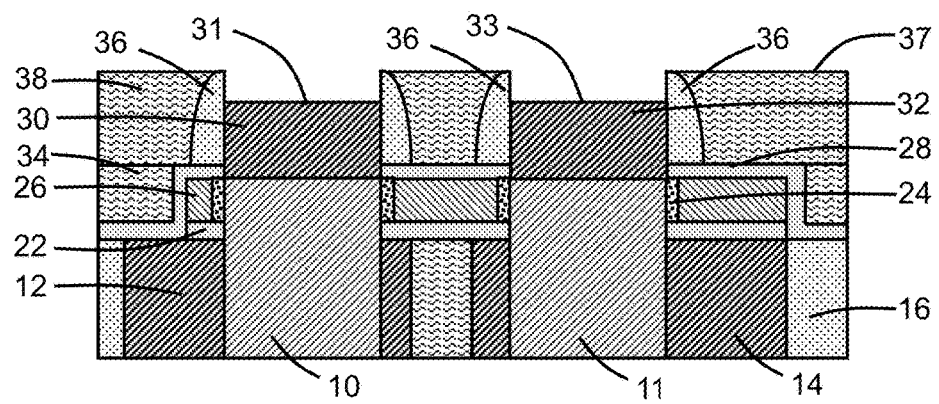

With reference to FIG. 4 in which like reference numerals refer to like features in FIG. 3 and at a subsequent fabrication stage, the top surfaces 31, 33 of the top source/drain regions 30, 32 are recessed relative to the spacers 36 and the top surface of the gap-fill dielectric layer 38. The spacers 36 project above the recessed top surfaces 31, 33. The etching process used to recess the top source/drain regions 30, 32 may remove the constituent semiconductor materials selective to the materials constituting the spacers 36 and the gap-fill dielectric layer 38. For example, the top source/drain regions 30, 32 may be recessed relative to the top surface 37 of the gap-fill dielectric layer 38 by one-third of their respective thicknesses. Spaces are formed above the top surface of the recessed top surfaces 31, 33 of the top source/drain regions 30, 32.

Figure 5:
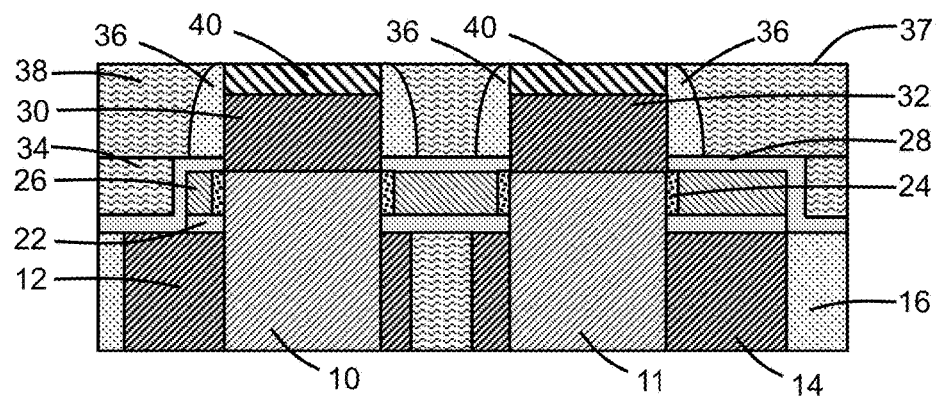

With reference to FIG. 5 in which like reference numerals refer to like features in FIG. 4 and at a subsequent fabrication stage, caps 40 are formed on the top surfaces 31, 33 (FIG. 4) of the top source/drain regions 30, 32 in the spaces opened when the top source/drain regions 30, 32 are recessed. The caps 40 may be formed by depositing a gap-fill layer comprised of a dielectric material and planarizing the gap-fill layer to the top surface of the spacers 36 and the top surface 37 of the gap-fill dielectric layer 38 with, for example, CMP. The caps 40 may be composed of a nitride-based material, such as silicon nitride ($Si_3N_4$), silicon oxynitride (SiON), silicon oxycarbide (SiOC), or silicon oxycarbonitride (SiOCN), deposited by ALD.

Figure 6:
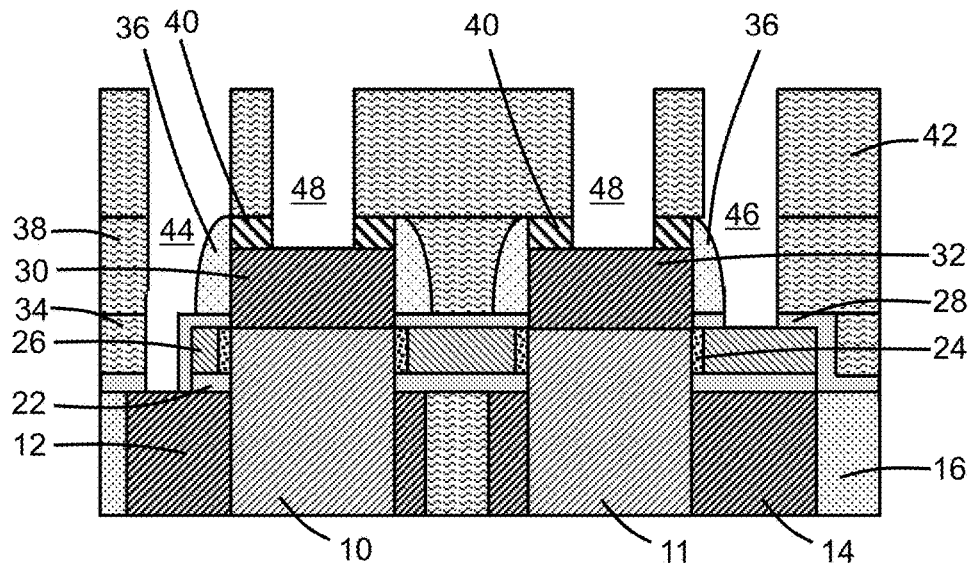

With reference to FIG. 6 in which like reference numerals refer to like features in FIG. 5 and at a subsequent fabrication stage, an interlayer dielectric layer 42 is formed that covers the field-effect transistors. The interlayer dielectric layer 42 may be composed of a dielectric material, such as an oxide of silicon (e.g., silicon dioxide ($SiO_2$)) deposited by chemical vapor deposition (CVD).

An opening 44 is formed in the dielectric layers 34, 38, 42 that extends to the bottom source/drain region 12. The opening 44 may be formed by applying an etch mask to the dielectric layer 42 and patterning the dielectric layers 34, 38, 42 with an etching process. The etch mask may be stripped after the opening 44 is formed. The etching process may be one or more reactive ion etching (RIE) processes with etch chemistries selected to etch the dielectric layers 34, 38, 42 and to punch through the dielectric material of the top spacer layer 28 covering the bottom source/drain region 12. The opening 44 is self-aligned relative to the bottom source/drain region 12 by the spacers 36, which add extra protection to the gate stack 26 and the top source/drain region 30 during the etching process forming opening 44. The lithography process used to form the opening 44 has an enhanced tolerance to misalignment and an improved overlay margin.

An opening 46 is formed in the dielectric layers 38, 42 that extends to the gate stack 26. The opening 46 may be formed by applying an etch mask to the dielectric layer 42 and patterning the dielectric layers 38, 42 with an etching process. The etch mask may include an organic planarization layer (OPL) material applied by spin-coating that fills the opening 44, and that is stripped after the opening 46 is formed. The etching process may be one or more reactive ion etching (RIE) processes with etch chemistries selected to etch the dielectric layers 38, 42 and to punch through the dielectric material of the top spacer layer 28 covering the gate stack 26. The opening 46 is self-aligned relative to the gate stack 26 by the spacers 36, which add extra protection to the top source/drain region 32 during the etching process forming opening 46. The lithography process used to form the opening 46 has an enhanced tolerance to misalignment and an improved overlay margin.

Openings 48 are formed in the dielectric layer 42 that extend to the top surface 31 of the top source/drain region 30 and to the top surface 33 of the top source/drain region 32. The openings 48 may be formed by applying an etch mask to the dielectric layer 42 and patterning the dielectric layer 42 and caps 40 with an etching process. The etch mask may include an organic planarization layer (OPL) material applied by spin-coating that fills the openings 44, 46, and that is stripped after the openings 48 are formed. The etching process may be one or more reactive ion etching (RIE) processes with etch chemistries selected to etch the dielectric layer 42 and to punch through the dielectric material of the caps 40 covering the top source/drain regions 30, 32. The remnants of the caps 40 define spacers located between the opening 44 and the top source/drain regions 30, 32, as well as between the opening 46 and the top source/drain regions 30, 32. The spacers defined by the remnants of the caps 40 are also located between the opening 44 and the opening 48, as well as between the opening 46 and the opening 48.

Figure 7:
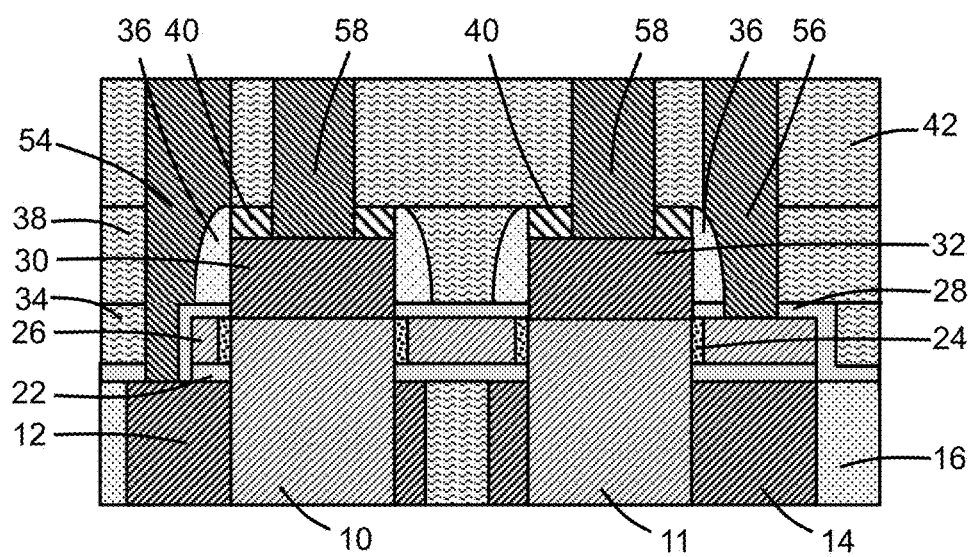

With reference to FIG. 7 in which like reference numerals refer to like features in FIG. 6 and at a subsequent fabrication stage, the openings 44, 46, 48 (FIG. 6) in the dielectric layers 34, 38, and 42 are filled with one or more conductors to respectively form contacts 54, 56, and 58. The openings 44, 46, 48 may be lined with a barrier layer, followed by filling with, for example, a metal silicide and/or tungsten (W) to form the contacts 54, 56, 58. The contact 54 extends vertically to the bottom source/drain region 12. The contact 56 extends vertically to the gate stack 26. The contacts 58 extend vertically to the respective top surfaces 31, 33 of the top source/drain regions 30, 32.

One of the spacers 36 and a spacer defined by a remnant of the cap 40 on top source/drain region 30 are located between the contact 54 and the top source/drain region 30. One of the spacers 36 and a spacer defined by a remnant of the cap 40 on top source/drain region 32 are located between the contact 56 and the top source/drain region 32. One of the spacers 36, a spacer defined by a remnant of the cap 40 on top source/drain region 30, and a section of the dielectric layer 42 are located between the contact 54 and one of the contacts 58. One of the spacers 36, a spacer defined by a remnant of the cap 40 on top source/drain region 30, and a section of the dielectric layer 42 are located between the contact 56 and the other of the contacts 58.

In an embodiment, all of the contacts 54, 56, 58 may be associated with a transistor formed using a single fin, e.g., fin 10 and having a single top source/drain region, e.g., top source/drain region 30. The arrangement of spacers, contacts, and the top source/drain region is unchanged in such an embodiment.

Figure 8:
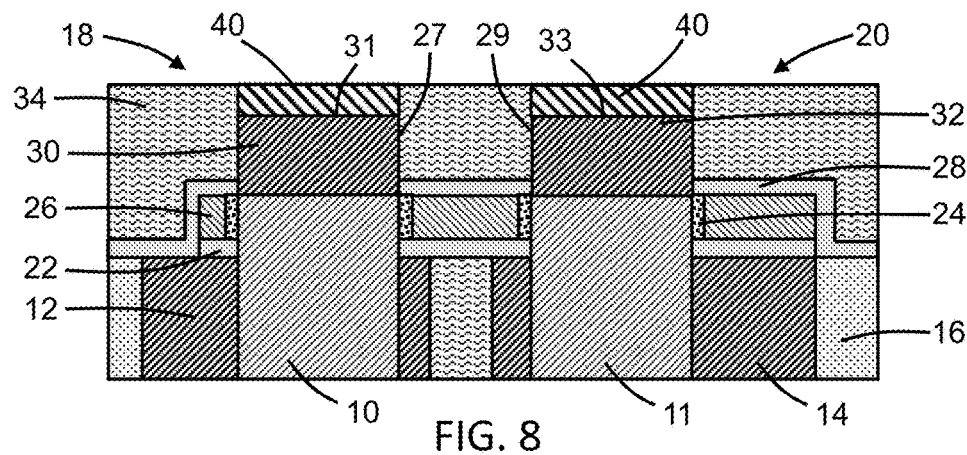
FIGS. 8-14 are cross-sectional views showing a structure at successive fabrication stages of a processing method in accordance with embodiments of the invention.

With reference to FIG. 8 in which like reference numerals refer to like features in FIG. 1 and at a subsequent fabrication stage in accordance with alternative embodiments of the invention, the top surfaces 31, 33 of the top source/drain regions 30, 32 are recessed relative to the top surface of the gap-fill dielectric layer 38. The caps 40 are formed on the top surfaces 31, 33 of the top source/drain regions 30, 32 in the spaces opened when the top source/drain regions 30, 32 are recessed.

Figure 9:
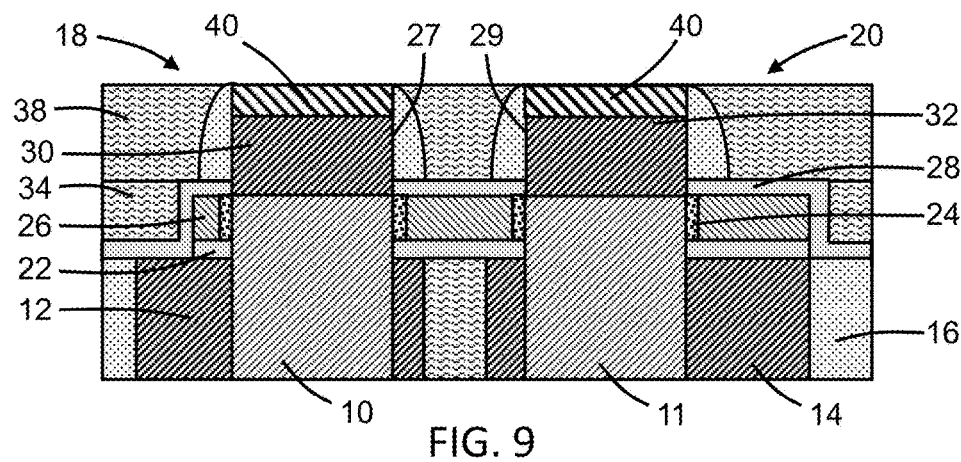

With reference to FIG. 9 in which like reference numerals refer to like features in FIG. 8 and at a subsequent fabrication stage, the interlayer dielectric layer 34 is recessed by an etch-back process with a timed etching process to reveal the sidewalls 27, 29 of the top source/drain regions 30, 32 and to reveal a section of the top spacer layer 28 covering the gate stack 26. In an embodiment, the sidewalls 27, 29 of the top source/drain regions 30, 32 may be fully revealed. After recessing the interlayer dielectric layer 34, the spacers 36 are formed adjacent to the sidewalls 27 of the top source/drain region 30, as well as adjacent to the sidewalls 29 of the top source/drain region 32. The spacers 36 may be formed by depositing a conformal layer comprised of a dielectric material chosen to etch selective to the dielectric material constituting interlayer dielectric layer 34 and shaping the conformal layer with an anisotropic etching process, such as reactive ion etching (RIE). The spacers 36 may be composed of a nitride-based material, such as silicon nitride ($Si_3N_4$), silicon oxynitride (SiON), silicon oxycarbide (SiOC), or silicon oxycarbonitride (SiOCN), deposited by, for example, ALD. The gap-fill dielectric layer 38 is deposited and planarized to the top surfaces 31, 33 of the top source/drain regions 30, 32 with, for example, chemical mechanical processing (CMP) to fill the open spaces.

Figure 10:
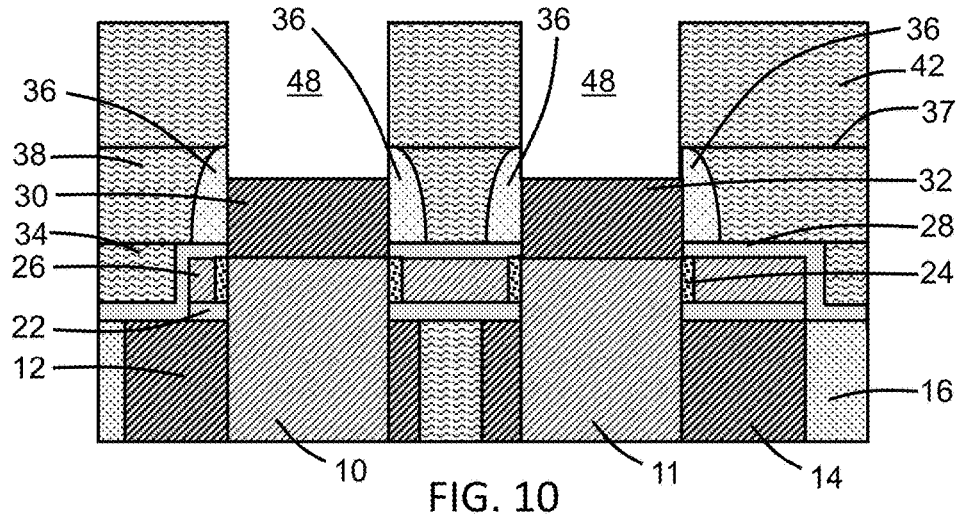

With reference to FIG. 10 in which like reference numerals refer to like features in FIG. 9 and at a subsequent fabrication stage, the interlayer dielectric layer 42 is formed that covers the field-effect transistors. The openings 48 are formed in the dielectric layer 42 that extend to the top surface 31 of the top source/drain region 30 and to the top surface 33 of the top source/drain region 32. The width of the openings 48 is increased such that the caps 40 are removed in their entirety, which may be accomplished with an etching process that removes the caps 40 selective to the spacers 36. The openings 48 are formed before the openings 44, 46 are formed.

Figure 11:
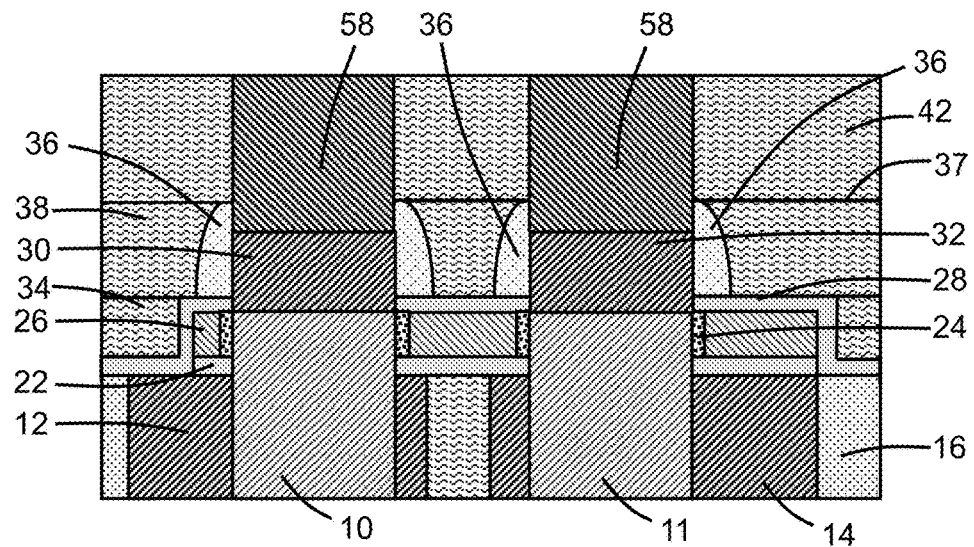

With reference to FIG. 11 in which like reference numerals refer to like features in FIG. 10 and at a subsequent fabrication stage, the contacts 58 are formed in the openings 48 that extend vertically to the respective top surfaces 31, 33 of the top source/drain regions 30, 32. Following planarization, the dielectric layer 42 and contacts 48 are coplanar at their top surfaces. The contacts 48 are fully strapped with the top source/drain regions 30, 32 in that the complete removal of the caps 40 permits the contacts 48 to touch or contact the entirety of the respective top surfaces of the top source/drain regions 30, 32.

Figure 12:
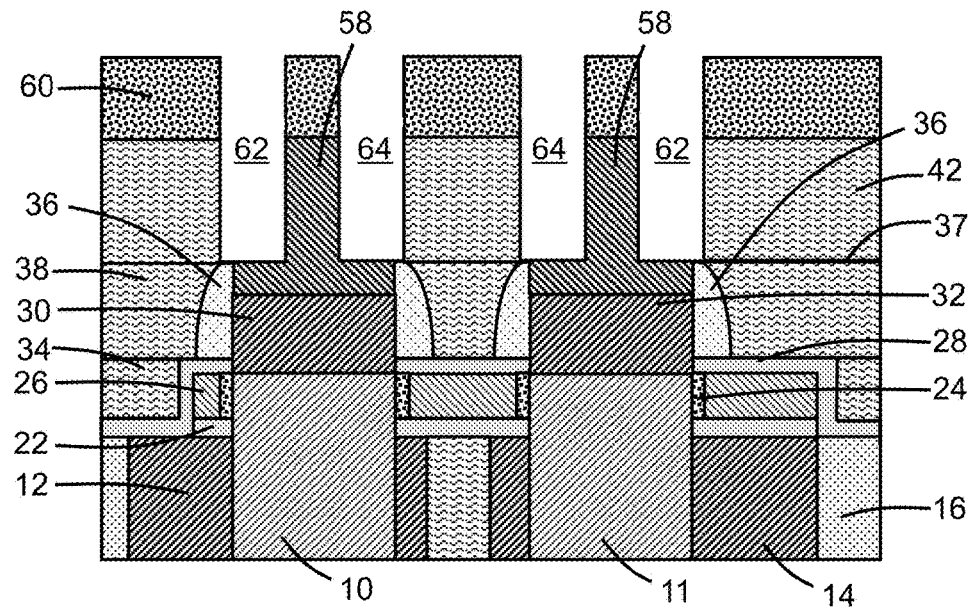

With reference to FIG. 12 in which like reference numerals refer to like features in FIG. 11 and at a subsequent fabrication stage, an etch mask 60 is formed on the dielectric layer 42 and contacts 58. The etch mask 60 may be composed of a layer of a light-sensitive material, such as an organic photoresist, applied by a spin coating process, pre-baked, exposed to light projected through a photomask, baked after exposure, and developed with a chemical developer. Openings 62, 64 may be formed in the dielectric layer 42 and contacts 58 by an etching process, which may be a reactive ion etching (RIE) process or a wet chemical process, using a given etch chemistry.

The formation of the openings 62, 64 divides each of the contacts 58 into a wide portion that is adjacent to the top source/drain regions 30, 32 and a narrow portion that is separated from the top source/drain regions 30, 32 by the wide portion. The fully-strapped state of the contacts with the top source/drain regions 30, 32 is maintained as the penetration depth of the openings 62, 64 into the contacts 58 is limited such that the openings 62, 64 do not penetrate through the full height of the contacts 58. The openings 62, 64 also extend laterally in width to overlap with the spacers 36.

Figures 13, 14:
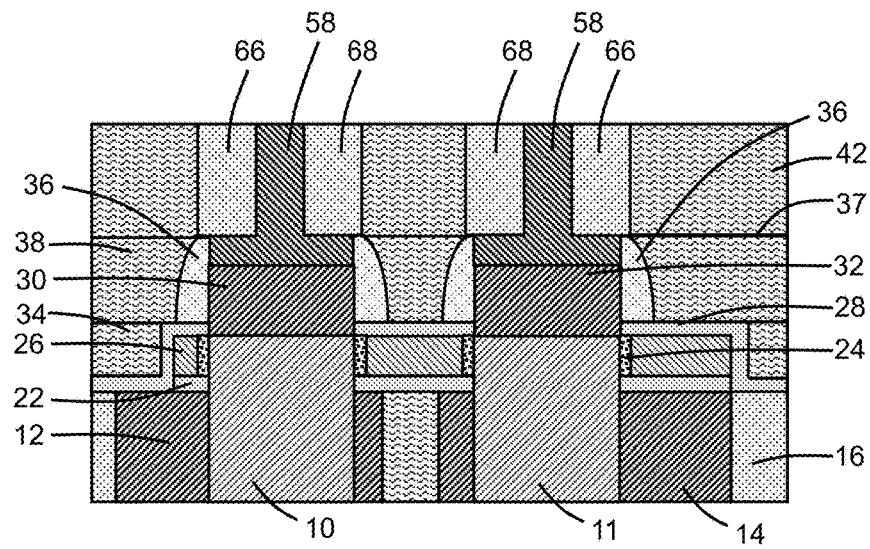

With reference to FIG. 13 in which like reference numerals refer to like features in FIG. 12 and at a subsequent fabrication stage, spacers 66, 68 are formed in the openings 62, 64 in the dielectric layer 42. The spacers 66, 68 may be composed of a nitride-based material, such as silicon nitride ($Si_3N_4$), silicon oxynitride (SiON), silicon oxycarbide (SiOC), or silicon oxycarbonitride (SiOCN), deposited by, for example, ALD and then planarized with CMP. The spacers 66 each overlap with one of the spacers 36 to provide a solid dielectric barrier.

With reference to FIG. 14 in which like reference numerals refer to like features in FIG. 13 and at a subsequent fabrication stage, the openings 44 and 46 are formed in the dielectric layers 34, 38, and 42 and filled with one or more conductors to respectively form the contacts 54 and 56. One of the spacers 36 and one of the spacers 66 are located between the contact 54 and the top source/drain region 30. One of the spacers 36 and one of the spacers 66 are located between the contact 56 and the top source/drain region 32. One of the spacers 36 and one of the spacers 66 are located between the contact 54 and one of the contacts 58, and each of the contacts 54, 58 may be in direct contact with the spacers 36, 66. One of the spacers 36 and one of the spacers 66 are located between the contact 56 and the other of the contacts 58, and each of the contacts 56, 58 may be in direct contact with the spacers 36, 66. Depending on the alignment of the openings 44 and 46, the contacts 54 and 56 may be located relative to the contacts 58 without an intervening section of the dielectric layer 42. In this instance, the spacers 66 directly contact the contacts 54, 56, and 58.

In an embodiment, all of the contacts 54, 56, 58 may be associated with a transistor formed using a single fin, e.g., fin 10 and having a single top source/drain region, e.g., top source/drain region 30. The arrangement of spacers, contacts, and the top source/drain region is unchanged in such an embodiment.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a vertical-transport field-effect transistor, the method comprising:
    forming a semiconductor fin that projects from a first source/drain region;
    epitaxially growing a second source/drain region that is spaced vertically along the semiconductor fin from the first source/drain region;
    forming a gate stack arranged between the second source/drain region and the first source/drain region;
    forming a first spacer adjacent to a first sidewall of the second source/drain region;
    forming a second spacer adjacent to a second sidewall of the second source/drain region;

after forming the first spacer and the second spacer, recessing a top surface of the second source/drain region;

forming a dielectric cap on the top surface of the second source/drain region;

forming a first contact extending through the dielectric cap and connected with a top surface of the second source/drain region;

forming a second contact connected with a top surface of the first source/drain region; and forming a third contact connected with a top surface of the gate stack, wherein the first spacer is arranged between the second source/drain region and the second contact or between the second source/drain region and the third contact.

2. The method of claim 1 wherein the first spacer and the second spacer are concurrently formed.

3. The method of claim 1 wherein forming the dielectric cap comprises:

depositing a dielectric material in a space above the top surface of the second source/drain region that is interior of the first spacer and the second spacer to form the dielectric cap.

4. The method of claim 1 wherein the first spacer is arranged between the second source/drain region and the second contact, and the second contact is in direct contact with the first spacer.

5. The method of claim 1 wherein the first spacer is arranged between the second source/drain region and the third contact, and the third contact is in direct contact with the first spacer.

6. A method of forming a vertical-transport field-effect transistor, the method comprising:

forming a semiconductor fin that projects from a first source/drain region;

epitaxially growing a second source/drain region that is spaced vertically along the semiconductor fin from the first source/drain region;

forming a gate stack arranged between the second source/drain region and the first source/drain region;

recessing a top surface of the second source/drain region;

forming a dielectric cap on the top surface of the second source/drain region;

after the dielectric cap is formed, forming a first spacer adjacent to a first sidewall of the second source/drain region;

forming a first contact connected with a top surface of the second source/drain region;

forming a second contact connected with a top surface of the first source/drain region; and forming a third contact connected with a top surface of the gate stack, wherein the first spacer is arranged between the second source/drain region and the second contact or between the second source/drain region and the third contact.

7. The method of claim 1 wherein the second source/drain region is formed in a dielectric layer, and forming the first spacer adjacent to the first sidewall of the second source/drain region comprises:

recessing the dielectric layer to reveal the first sidewall of the second source/drain region.

8. The method of claim 6 wherein the first spacer is arranged between the second source/drain region and the second contact, and further comprising:

forming a second spacer adjacent to a second sidewall of the second source/drain region, wherein the second spacer is arranged between the second source/drain region and the third contact.

9. The method of claim 6 wherein the first spacer is arranged between the second source/drain region and the third contact, and further comprising:

forming a second spacer adjacent to a second sidewall of the second source/drain region, wherein the second spacer is arranged between the second source/drain region and the second contact.

10. The method of claim 6 wherein the first spacer is arranged between the second source/drain region and the second contact, and the second contact is in direct contact with the first spacer.

11. The method of claim 6 wherein the first spacer is arranged between the second source/drain region and the third contact, and the third contact is in direct contact with the first spacer.

12. The method of claim 6 wherein the second source/drain region is formed in a dielectric layer, and forming the first spacer adjacent to the first sidewall of the second source/drain region comprises:

recessing the dielectric layer to reveal the first sidewall of the second source/drain region.

13. The method of claim 6 wherein forming the first contact connected with the top surface of the second source/drain region further comprises:

before forming the first contact, completely removing the dielectric cap from the top surface of the second source/drain region, wherein the first contact includes a first portion that directly contacts an entirety of the top surface of the second source/drain region.

14. The method of claim 8 wherein the first spacer and the second spacer are concurrently formed.

15. The method of claim 8 wherein forming the dielectric cap comprises:

depositing a dielectric material in a space above the top surface of the second source/drain region that is interior of the first spacer and the second spacer to form the dielectric cap.

16. The method of claim 9 wherein the first spacer and the second spacer are concurrently formed.

17. The method of claim 13 further comprising:

narrowing a second portion of the first contact that is arranged over the first portion of the first contact; and forming a second spacer arranged adjacent to the second portion of the first contact and over the first portion of the first contact.

18. The method of claim 17 wherein the second spacer is arranged between the first contact and the second contact after the second contact is formed, and the first contact and the second contact are in direct contact with the second spacer.

19. The method of claim 17 wherein the second spacer is arranged between the first contact and the third contact after the third contact is formed, and the first contact and the third contact are in direct contact with the second spacer.

* * * * *